United States Patent
Lung et al.

(10) Patent No.: US 7,561,463 B2
(45) Date of Patent: Jul. 14, 2009

(54) THIN FILM PHASE-CHANGE MEMORY

(75) Inventors: Hsiang-Lan Lung, Hsinchu (TW); Yi-Chou Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/825,193

(22) Filed: Jul. 3, 2007

(65) Prior Publication Data

US 2007/0258279 A1 Nov. 8, 2007

Related U.S. Application Data

(60) Continuation of application No. 11/485,241, filed on Jul. 11, 2006, now Pat. No. 7,247,511, which is a division of application No. 10/764,750, filed on Jan. 26, 2004, now Pat. No. 7,138,687.

(51) Int. Cl.
*G11C 11/00* (2006.01)

(52) U.S. Cl. .......................... 365/163; 365/63; 365/148

(58) Field of Classification Search ................. 365/148, 365/163, 63
See application file for complete search history.

(56) References Cited

U.S. PATENT DOCUMENTS

| | | | |
|---|---|---|---|
| 6,031,287 A | 2/2000 | Harshfield | |
| 6,111,264 A | 8/2000 | Wolstenholme et al. | |
| 6,114,713 A | 9/2000 | Zahorik | |
| 6,189,582 B1 | 2/2001 | Reinberg et al. | |
| 6,466,498 B2 | 10/2002 | Hogan | |
| 6,579,760 B1 * | 6/2003 | Lung | 438/257 |
| 6,621,095 B2 * | 9/2003 | Chiang et al. | 257/5 |
| 6,778,420 B2 | 8/2004 | Parkinson | |
| 6,838,692 B1 * | 1/2005 | Lung | 257/4 |
| 6,850,432 B2 | 2/2005 | Lu et al. | |
| 6,867,425 B2 * | 3/2005 | Wicker | 257/3 |
| 6,873,538 B2 * | 3/2005 | Hush | 365/148 |
| 6,903,361 B2 * | 6/2005 | Gilton | 257/2 |
| 6,969,866 B1 * | 11/2005 | Lowrey et al. | 257/3 |
| 6,972,429 B1 | 12/2005 | Hsueh et al. | |
| 7,050,327 B2 * | 5/2006 | Campbell | 365/159 |
| 7,071,021 B2 | 7/2006 | Harshfield et al. | |
| 7,161,167 B2 * | 1/2007 | Johnson | 257/5 |
| 7,180,767 B2 | 2/2007 | Chen et al. | |
| 7,337,160 B2 | 2/2008 | Marshall et al. | |
| 2005/0174861 A1 * | 8/2005 | Kim et al. | 365/200 |

* cited by examiner

*Primary Examiner*—Pho M. Luu
*Assistant Examiner*—Alexander Sofocleous
(74) *Attorney, Agent, or Firm*—Stout, Uxa, Buyan & Mullins, LLP

(57) ABSTRACT

A memory cell comprises a chalcogenide random access memory (CRAM) cell and a CMOS circuit. The CMOS circuit accesses the CRAM cell. The CRAM cell has a cross-sectional area that is determined by a thin film process (e.g., a chalcogenide deposition thin film process) and by an iso-etching process. If desired, the chalcogenide structure may be implemented in series with a semiconductor device such as a diode or a selecting transistor. The diode drives a current through the chalcogenide structure. The selecting transistor drives a current through the chalcogenide structure when enabled by a voltage at a gate terminal of the selecting transistor. The selecting transistor has a gate terminal, a source terminal, and a drain terminal; the gate terminal may be operatively coupled to a word line of a memory array, the source terminal may be operatively coupled to a drive line of the memory array, and the drain terminal may be operatively coupled to a bit line of the memory array.

20 Claims, 17 Drawing Sheets

Top view

THIN FILM PHASE-CHANGE MEMORY

CROSS-REFERENCE TO RELATED APPLICATIONS

This application is a continuation application of U.S. application Ser. No. 11/485,241, filed Jul. 11, 2006, now U.S. Pat. No. 7,247,511 which is a divisional application of U.S. application Ser. No. 10/764,750, filed on Jan. 26, 2004, now U.S. Pat. No. 7,138,687, the contents of all which are expressly incorporated herein by reference.

BACKGROUND OF THE INVENTION

1. Field of the Invention

The present invention relates generally to chalcogenide memories and, more particularly, to thin film phase-change memories.

2. Description of the Related Art

Chalcogenide phase-change memories are not easily driven by CMOS circuits. The chemical compounds known as chalcogenides generally require relatively high currents (or, more specifically, current densities) before undergoing a change of phase. Reducing the cross-sectional area of the chalcogenide or electrode can reduce the current requirement directly. Many structures have been proposed to reduce area, for example, by fabricating an ultra small contact and placing the chalcogenide into the contact. However, these efforts can be limited by lithography. Furthermore, it can be difficult to place materials into ultra small holes.

Wolstenholme, et al. (U.S. Pat. No. 6,111,264, entitled "Small pores defined by a disposable internal spacer for use in chalcogenide memories") and Reinberg (U.S. Pat. No. 6,189,582, entitled "Small electrode for a chalcogenide switching device and method for fabricating same,") describe processes of lithographically implementing several small holes (also called "pores" or "ultra small pores"). To the extent pores with reduced pore sizes are possible, a shrinking ratio of such pores is not unlimited since, for example, overhanging dielectric material may seal the hole when the hole is made too small. Therefore, the pore size can be limited by lithography. Accordingly, the pore size can be difficult to scale down. Also, the size uniformity of the ultra small pores can be difficult to control. Moreover, as previously alluded, it can be difficult to place chalcogenide into the holes.

Harshfield (U.S. Pat. No. 6,031,287, entitled "Contact structure and memory element incorporating the same,") and Zahorik (U.S. Pat. No. 6,114,713, entitled "Integrated circuit memory cell having a small active area and method of forming same") describe electrode areas that can be reduced, but the shrinking ratio can be limited by the film thickness. For example, if pore diameter is 0.15 um and film thickness is 200 Å, the shrinkage ratio is only approximately 50%. Therefore, the pore size is basically limited by lithography and can be scaled down only with difficulty. Additionally, the phase change region may depart from the electrode. Therefore, the ON/OFF ratio may not be as large as expected. The electrode may be very weak because the current flow in the electrode is very high. Thus, the electrode can limit the current. Accordingly, processes wherein photo/thin film techniques define the cross-sectional area of chalcogenide are not without shortcomings.

A need exists in the prior art for a phase change that can easily be driven by a CMOS circuit. A further need exists for a phase change memory having a reduced cross-sectional area that can reduce the current requirement directly.

SUMMARY OF THE INVENTION

Briefly, in accordance with an aspect of the present invention, a thin film process and an iso-etching process are used to define a cross-sectional area of a chalcogenide memory cell. Therefore, the cross-sectional area need no longer be limited by lithography. The placement of materials into ultra small holes may also be vitiated. Moreover, the chalcogenide memory cell has a cross-sectional area that is ultra small, and, as a result, the chalcogenide memory cell can have a dramatically decreased current/power requirement.

In accordance with another aspect of the present invention, a novel memory cell and process flow fabricates a chalcogenide phase change memory (i.e., the chalcogenide memory cell). With this novel memory cell and process, the cross-sectional area of the chalcogenide memory cell can be ultra small. The cross-sectional area of the chalcogenide memory cell is defined by a chalcogenide film thickness. An iso-etch process is another one of several photo/iso-etching processes that collectively define the cross-sectional area of the chalcogenide memory cell. The extra iso-etch process decreases a width of the chalcogenide memory. Thus, the cross-sectional area can be reduced, to thereby commensurately reduce a current/power requirement of the chalcogenide phase-change memory.

In accordance with yet another aspect of the present invention, a chalcogenide memory cell having a cross-sectional area that is ultra small can be relatively easily fabricated, since there is no need to place materials into small pores (i.e., ultra small holes).

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
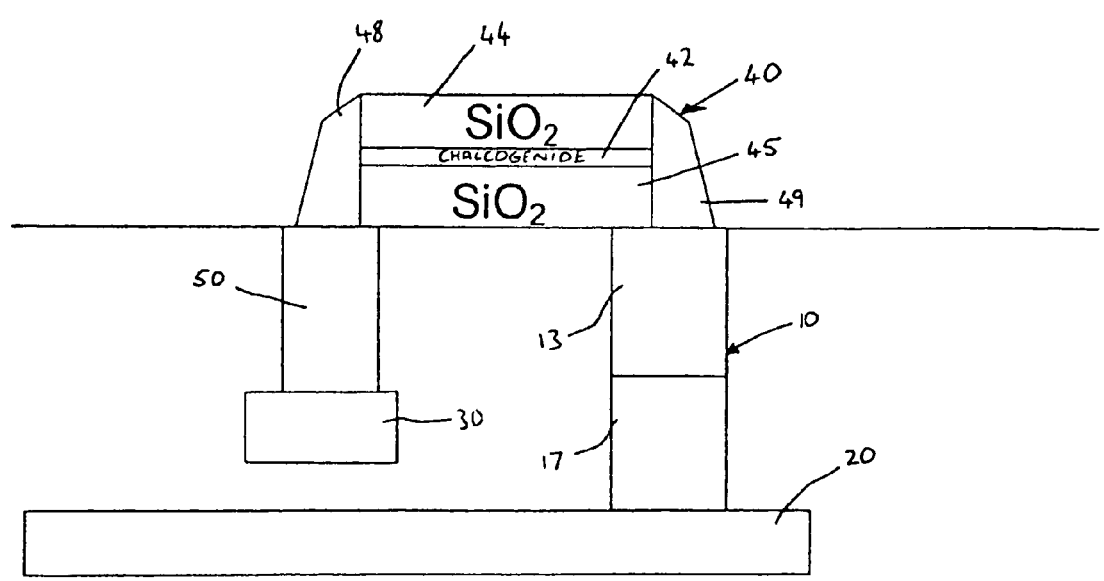
FIG. 1 is a cross-sectional structural diagram depicting a chalcogenide memory cell, in accordance with one embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of thin film phase-change memories. The present invention may be practiced in conjunction with various chalcogenide memory manufacturing techniques that are conventionally used in the art, and only so much of the commonly practiced process steps are included herein as are necessary to provide an understanding of the present invention. The present invention has applicability in the field of thin film phase-change memories in general. For illustrative purposes, however, the following description pertains to chalcogenide memories.

Referring more particularly to the drawings, FIG. 1 is a cross-sectional structural diagram depicting a chalcogenide memory cell, in accordance with one embodiment of the present invention. The chalcogenide memory cell comprises a diode 10 in series with a chalcogenide random access memory (CRAM) cell 40. The diode 10 comprises a p-type polysilicon structure 13 and an N-type polysilicon structure 17 implemented on a tungsten line 20. The CRAM cell 40 comprises a lower silicon-dioxide layer 45, an upper silicon dioxide layer 44, a pair of titanium nitride spacer structures 48, 49, and a chalcogenide layer 42. The CRAM cell 40 is connected via a tungsten plug 50 to an aluminum or tungsten line 30, and via the diode 10 to the tungsten line 20.

A current is necessary for writing to the chalcogenide memory cell as implemented in the illustrated embodiment of the present invention, in which the aluminum or tungsten line 30 is coupled to the chalcogenide structure 42 via a tungsten plug 50 as shown in FIG. 1. Writing to the chalcogenide memory cell is accomplished by driving a current into the chalcogenide structure 42 in a current path between the titanium nitride spacers 48, 49. The current is small, in accordance with an aspect of the present invention, since the chalcogenide structure 42 has a relatively small cross-sectional area.

The chalcogenide memory cell has a cross-sectional area that is determined by a chalcogenide deposition thin film process. In other words, the chalcogenide structure 42 has a height that is determined by the thickness of a chalcogenide layer that is deposited and then etched. An iso-etching process also determines the cross-sectional area of the chalcogenide memory cell. If the width of the iso-etched chalcogenide memory cell is 500 Å. and the chalcogenide layer thickness is 200 Å, then the cross-sectional area will be less than 0.001 um.sup.2. This is the cross-section of a 0.036 um contact.

It will be recalled that chalcogenide structures have traditionally been implemented by placing small amounts of chalcogenide into small pores or holes in, for example, a silicon dioxide layer. The holes are traditionally imprecise, since etching through a reticle mask may not be precisely directional; consequently, the holes can have sidewalls that are not precisely parallel. Maintaining an etching (regardless of whether the etch is accomplished by chemical dissolution or ion bombardment) until a pore passes entirely through a silicon dioxide layer inescapably allows a pore to widen as the etching persists, and forcing chalcogenide into the pore also inescapably widens the pore. These problems are traditionally exacerbated when the layers of silicon dioxide are thick, and yet thick layers of silicon dioxide are necessary when lithography is used to control the length of the current path through the chalcogenide structure.

FIG. 1 illustrates how the chalcogenide memory cell of the first embodiment of the present invention addresses these problems, wherein the chalcogenide structure 42 is implemented horizontally, rather than vertically. The chalcogenide structure 42 has an arbitrary length that is completely controllable without requiring, for example, thick layers of silicon dioxide. Instead of tapering down through a pore in the silicon dioxide layer, the chalcogenide structure 42 has a cross-sectional area that can be relatively consistent throughout the length of the chalcogenide structure 42.

This thin film process of chalcogenide deposition can result in a thin horizontal chalcogenide layer that may be not only thinner than vertical pores lithographically achievable through silicon dioxide, but also relatively uniform. The iso-etching process can create a relatively narrow horizontal chalcogenide structure 42, which can be narrower than that achievable though vertical pores of silicon-dioxide lithography. Collectively, in accordance with the present invention, the chalcogenide deposition thin film process and the iso-etching process can essentially eliminate any need to create a uniformly-wide hole through a thick layer of silicon dioxide and then force a uniformly-wide structure of chalcogenide into the hole.

In fact, the cross-sectional area of the present chalcogenide structure 42 can be so small that current densities sufficient to change the phase of the chalcogenide are achievable using standard CMOS circuits. Typical CMOS circuits, as used in computer architecture, normally do not generate current densities that are large enough to change the phase of a chalcogenide structure. However, since the chalcogenide structure 42 of FIG. 1 has such a small cross-sectional area, the relatively small amount of current generated by typical CMOS circuits can be adequate to write to the chalcogenide memory cells in accordance with the illustrated embodiment of the present invention.

As embodied herein, the chalcogenide structure 42 of the chalcogenide memory cell in FIG. 1 is implemented horizontally, essentially parallel with the substrate, and therefore differs markedly from chalcogenide structures that might be implemented vertically through a pore in a silicon dioxide layer. Since the chalcogenide layer deposited by a thin film deposition can be extremely small, etching through a reticle mask need not be precisely directional.

Figure 2:
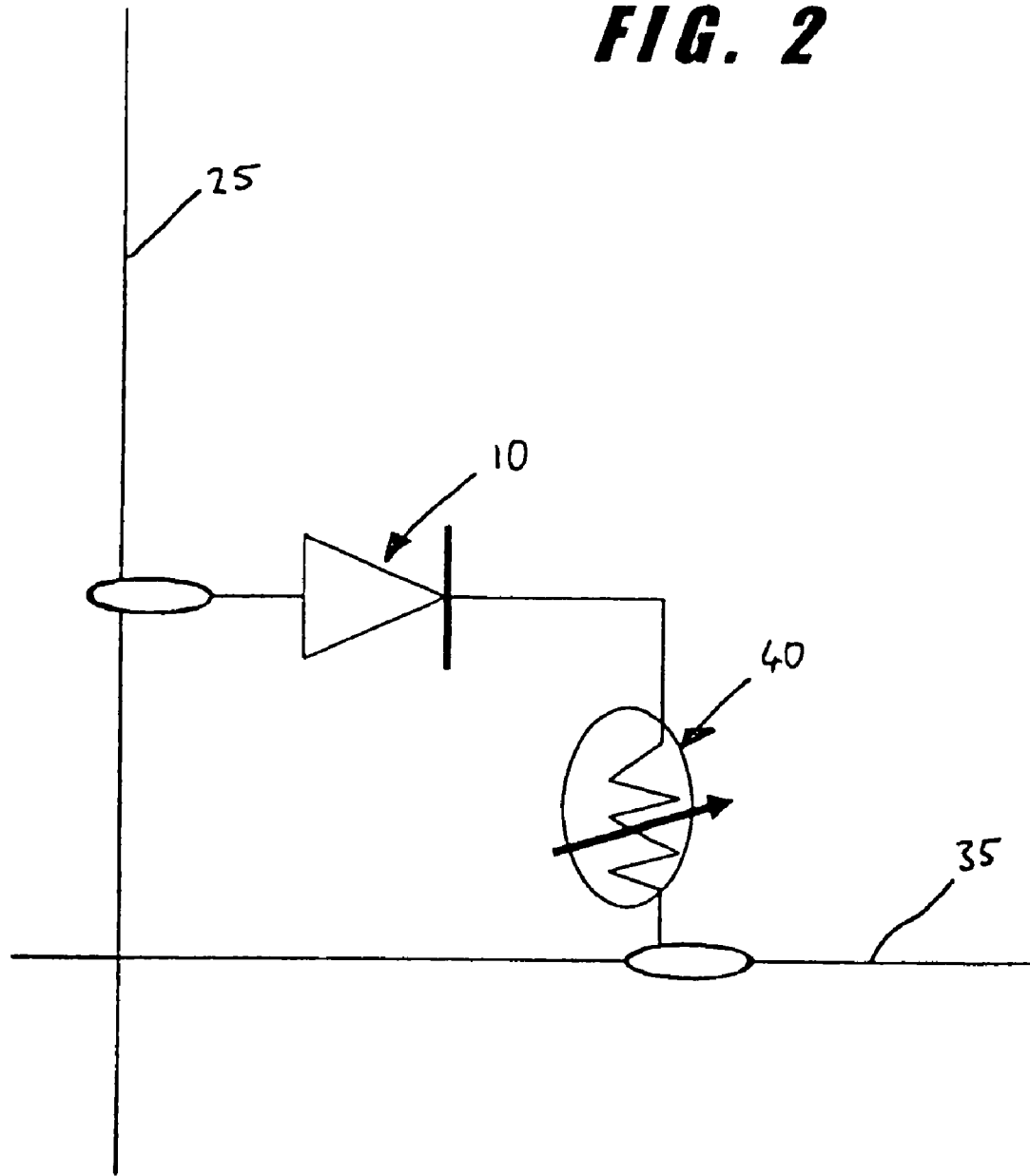
FIG. 2 is a schematic diagram depicting the chalcogenide memory cell of FIG. 1.

FIG. 2 is a schematic diagram depicting the chalcogenide memory cell of FIG. 1, wherein the chalcogenide memory cell is represented as a CRAM cell 40 and the diode 10 is represented by a traditional symbol of a diode. The tungsten line 20 of FIG. 1 is represented in FIG. 2 as a word line 25, and the aluminum or tungsten line 30 of FIG. 1 is represented in FIG. 2 as a bit line 35. The diode 10 is connected to the word line 25 and the CRAM cell 40, and the CRAM cell 40 is connected to the bit line 35.

The CRAM cell 40 of FIG. 2 has a resistance (or, from another perspective, a conductance) that depends on the phase of the chalcogenide within the CRAM cell 40. When the chalcogenide of the CRAM cell 40 is in the crystalline state, the CRAM cell 40 has a small resistance (and a large conductance). When the chalcogenide of the CRAM cell 40 is in the amorphous state, the CRAM cell 40 has a large resistance (and a small conductance).

FIG. 2 highlights the integration of a low-current CMOS component with a chalcogenide memory cell, ordinarily regarded as requiring a relatively large current for writing. In FIG. 2 a diode 10 is shown implemented with CMOS technology (and therefore operating at a low electric current) in series with a chalcogenide memory cell (having a chalcogenide structure 42 for storing data). Since the chalcogenide memory cell as implemented in accordance with the first embodiment of the present invention has such a small cross-sectional area and therefore such a low current/power requirement, it may be written with the low currents that are found in typical CMOS circuits such as the diode 10.

In the illustrated embodiment, the chalcogenide memory cell comprises a CRAM cell and a CMOS circuit that is operative to access the CRAM cell. The CRAM cell has cross-sectional area determined by a thin film process and by an iso-etching process; specifically, by a chalcogenide deposition thin film process and by an iso-etching process. The chalcogenide structure is in series with a semiconductor device, which in the embodiment illustrated in FIG. 2 is a diode 10 that is operative to drive a current through the chalcogenide structure.

Figure 3:
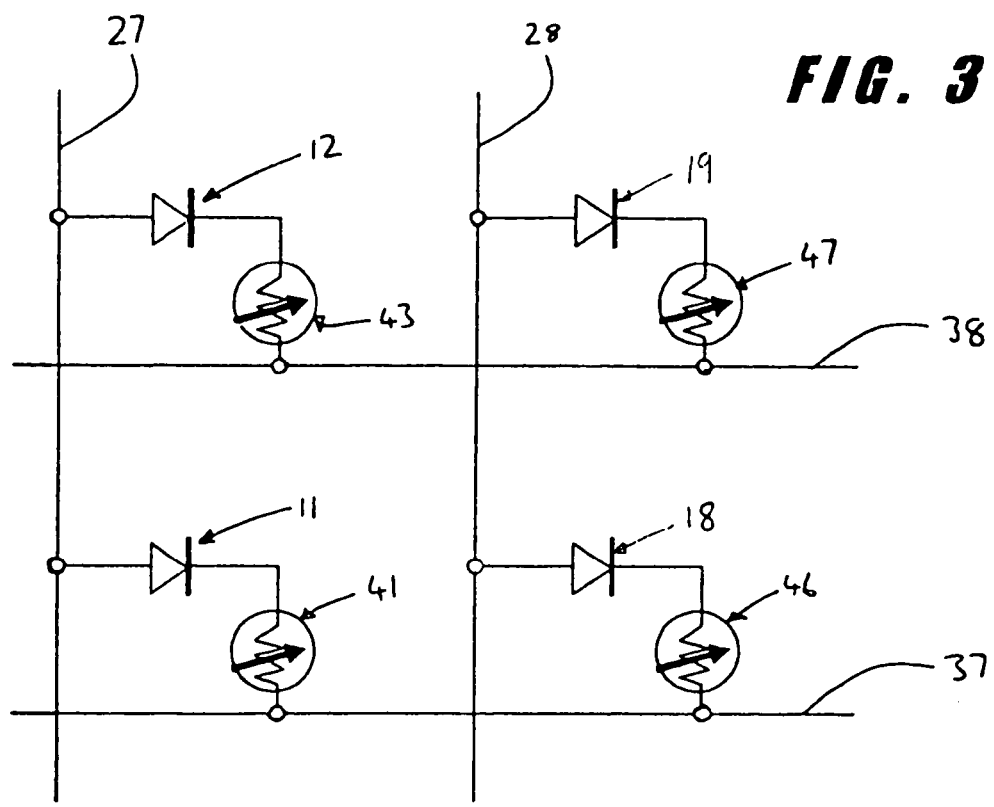
FIG. 3 is a schematic diagram depicting a memory array comprising four chalcogenide memory cells, each of which is in accordance with the chalcogenide memory cell of FIG. 2.

FIG. 3 is a schematic diagram depicting a memory array comprising four chalcogenide memory cells, each of which is constructed in accordance with the chalcogenide memory cell of FIG. 2. A word line 27 and a word line 28 provide enabling signals to a first memory location (for example, a byte 0) and a second memory location (for example, a byte 1), respectively. Either word line 27 or word line 28 is active. The active word line provides a strong current (to write) or a weak current (to read) that passes through the diodes which are coupled thereto. For example, if word line 27 is active, then a current passes through a diode 11 and through the CRAM cell 41 to bit line 37, and a current passes through a diode 12 and through the CRAM cell 43 to bit line 38.

With respect to writing, if word line 27 has a high voltage and bit line 37 has a low voltage, such that the difference between the voltage of word line 27 and the voltage of bit line 37 exceeds a predetermined potential, then CRAM cell 41 is written.

With respect to reading, if word line 27 has a high voltage and bit line 37 has a low voltage, such that the difference between the voltage of word line 27 and the voltage of bit line 37 exceeds 0.4 volts but does not exceed 1.5 volts, then CRAM cell 41 is read without being written. The voltage drop between the voltage of word line 27 and the voltage of bit line 37 drives a current through the diode 11 and the CRAM cell 41. Since the voltage drop across the diode 11 is fixed, the remaining voltage drop across the CRAM cell 41 drives the current through the diode 11 and the CRAM cell 41. The current is read by a current-dependent circuit (not shown) coupled to bit line 37.

Alternatively, with respect to reading, a current source/drain that draws a predetermined current may be used to read a CRAM cell. If a bit line has a current source/drain that draws a predetermined current through the bit line, the predetermined current is drawn only through an "enabled" diode. i.e. a diode that is coupled to a word line that has a sufficiently high voltage. The predetermined current through the diode provides a fixed voltage drop (generally 0.6 to 0.7 volts across the diode). The voltage at the anode of the CRAM cell, coupled to the enabled diode, is therefore 0.6 to 0.7 volts less than the high voltage of the word line.

Since typically no more than one word line has a high voltage (i.e., a voltage exceeding a predetermined potential sufficient to enable a diode), all of the predetermined current passes through the CRAM cell that is coupled to the enabled diode and to the enabled word line. The predetermined current through the bit line and the voltage at the anode of an enabled CRAM cell are both known; therefore, the voltage at the bit line can be used to read the resistance of the CRAM cell.

As with other types of memories that may be used in complex memory systems, a word line may allow some bits to be written while other bits are being read. In a snoop-enabled cache, for example, a "shared" bit might be set whenever one process reads data that another process has written; the shared bit indicates that the writer no longer has exclusive control of the memory location. If a processor in a multiprocessor system uses a memory location to exchange data with another processor, then a "contains valid data" bit may be cleared once the destination processor has read the data, re-enabling the memory location for subsequent writing. In a multi-threaded and/or non-sequential processor, a memory location's "contains valid data" bit might be cleared when its data has been read, enabling the memory location for subsequent overwriting.

Additional word lines, with corresponding CRAM cells in accordance with the chalcogenide memory cell of FIG. 2, may also be added to extend the number of memory locations available to the memory array. Additional bit lines, with corresponding CRAM cells in accordance with the chalcogenide memory cell of FIG. 2, may also be added to extend the number of bits per byte within each of the memory locations available to the memory array.

The current through any particular CRAM cell is read by a current-dependent circuit (not shown) coupled to a corresponding bit line. For example, a reversed-biased or Zener diode may serve as the current-dependent circuit.

FIG. 3 again highlights the integration of a low-current CMOS component with a chalcogenide memory cell. The chalcogenide memory cell is ordinarily regarded as requiring a large current for writing, but as shown in FIG. 3 may be integrated into a memory array that includes CMOS circuits such as the diodes. The chalcogenide memory cell as implemented in accordance with the first embodiment of the present invention has such a small cross-sectional area that its current/power requirement for writing is achievable with the low currents that are found in typical CMOS circuits such as the diode.

The memory array of FIG. 3 comprises a plurality of CRAM cells, a plurality of word lines, and a plurality of bit lines. Each of the CRAM cells has a cross-sectional area determined by a thin film process (e.g., a chalcogenide deposition thin film process) and by an iso-etching process. Each word line of the plurality of word lines is operative to assert a data word ("word"). The data word may be, for example, eight bits, sixteen bits, or thirty-two bits. The data word may be regarded as a subset of the CRAM cells; each CRAM cell of the subset may be regarded as a distinct bit of the data word. Each CRAM cell of the subset is coupled to the word line.

The word line is asserted in response to a CMOS circuit, which may comprise, for example, a memory controller, a DMA (direct memory access), a cache controller, or another logic circuit. In accordance with an aspect of the present invention, the word line is coupled to the CRAM cell via a semiconductor device in series. For example, the semiconductor device shown is a diode operative to drive a current through the chalcogenide structure. If desired, the semiconductor device can comprise a selecting transistor operative to drive a current through the chalcogenide structure when enabled by a voltage at a gate terminal of the selecting transistor. The gate terminal of the selecting transistor can be operatively coupled to a word line of a memory array, the source terminal of the selecting transistor can be operatively coupled to a drive line of the memory array, and the drain terminal of the selecting transistor can be operatively coupled to a bit line of the memory array.

The memory array of FIG. 3 also comprises a plurality of bit lines, wherein each of the bit lines is operatively coupled to access a group of the CRAM cells. Each of the CRAM cells that is operatively coupled to a bit line belongs to a distinct data word; for example, bit line 37 may be coupled to bit-0 of word 0, to bit-0 of word 1, to bit-0 of word 2, etc. When a word line is asserted to select a word, each bit line accesses a bit of the selected word.

Figure 4:
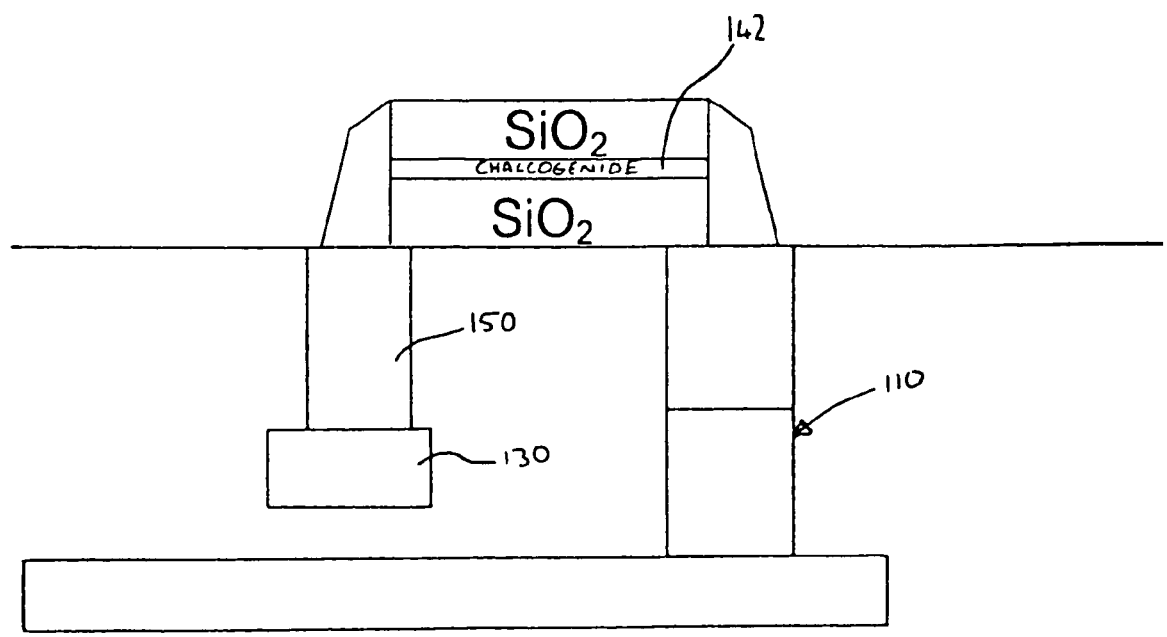
FIG. 4 is a cross-sectional schematic representation of a chalcogenide memory cell, in accordance with a second illustrated embodiment of the present invention.

FIG. 4 is a schematic representation of a chalcogenide memory cell, in accordance with a second illustrated embodiment of the present invention. The chalcogenide memory cell of FIG. 4 can differ from the chalcogenide memory cell of FIG. 1 in that, for example, the tungsten plug 50 has been replaced with P-type silicon (or p-doped polysilicon) 150. Replacing the tungsten plug 50 with P-type silicon 150 can allow the tungsten line 130 to be coupled to the chalcogenide structure 142 at the substrate layer rather than at a metalization layer, allowing for example a smaller and simpler device. The chalcogenide memory cell of FIG. 4 can have an extremely low current/power requirement, which can be low enough to be writable with the low currents that are found in typical CMOS circuits such as the diode 110.

Like the current necessary to write to the chalcogenide memory cell of FIG. 1, the current necessary to write to the chalcogenide memory cell of FIG. 4 is small, since the chalcogenide structure has a small cross-sectional area. The chalcogenide memory cell of FIG. 4, like the chalcogenide memory cell of FIG. 1, has a cross-sectional area that is determined by a chalcogenide deposition thin film process. In other words, the chalcogenide structure 142 has a height that is determined by the thickness of a chalcogenide layer that is deposited and then etched. An iso-etching process also determines the cross-sectional area of the chalcogenide memory cell. If the width of iso-etched chalcogenide memory cell is 500 Å. and the chalcogenide layer thickness is 200 Å, the cross-section area is less than 0.001 um.sup.2. This is the cross-section of a 0.036 um contact.

Like the chalcogenide structure 42 of FIG. 1, the chalcogenide structure 142 of FIG. 4 is implemented horizontally, rather than vertically. The chalcogenide structure 142 has an arbitrary length that is completely controllable without requiring thick layers of silicon dioxide. Instead of tapering down through a pore in the silicon dioxide layer, the chalcogenide structure has a cross-sectional area that is consistent throughout the length of the chalcogenide structure. The chalcogenide deposition thin film process and the iso-etching process essentially eliminate any need to create a uniformly-wide hole through a thick layer of silicon dioxide and then force a uniformly-wide structure of chalcogenide into the hole.

Like the cross-sectional area of the chalcogenide structure 42 of FIG. 1, the cross-sectional area of the chalcogenide structure 142 of FIG. 4 is so small as to be capable of undergoing a change of phase in response to the small current densities that are achievable using standard CMOS circuits. Typical CMOS circuits, as used in computer architecture, normally do not normally generate current densities that are large enough to change the phase of chalcogenide structures that typically have large cross-sections. However, since the chalcogenide structure 142 of FIG. 4 has such a small cross-sectional area, the small amount of current generated by the typical CMOS circuits is actually adequate to write to the chalcogenide memory cells in accordance with the first embodiment of the present invention.

Like the chalcogenide structure 42 of FIG. 1, the chalcogenide structure 142 of FIG. 4 is implemented horizontally, essentially parallel with the substrate, and therefore differs markedly from chalcogenide structures that might be implemented vertically through a pore in the silicon dioxide layer. Since the chalcogenide layer deposited by a thin film deposition is extremely small, etching through a reticle mask need not be precisely directional.

Figure 5:
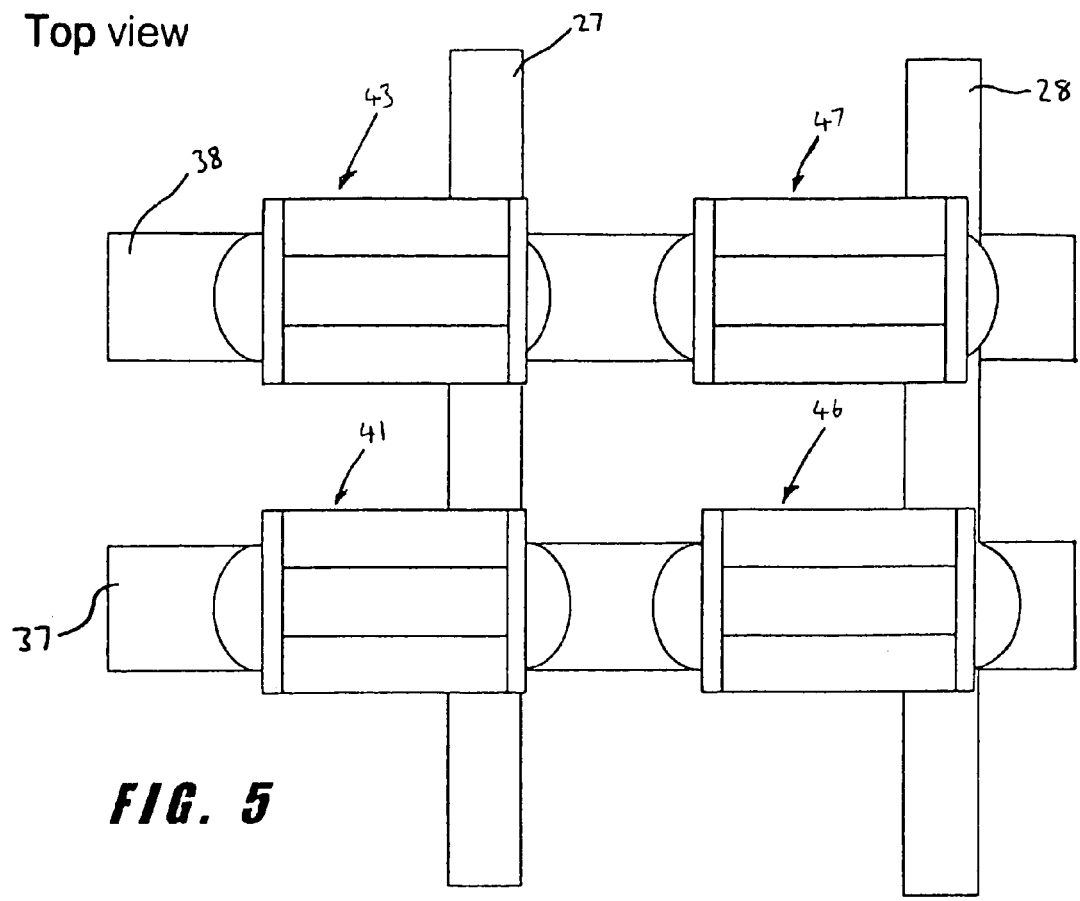
FIG. 5 is a schematic diagram depicting a top view of a memory array comprising four chalcogenide memory cells, in accordance with the memory array of FIG. 3.
Figure 6:
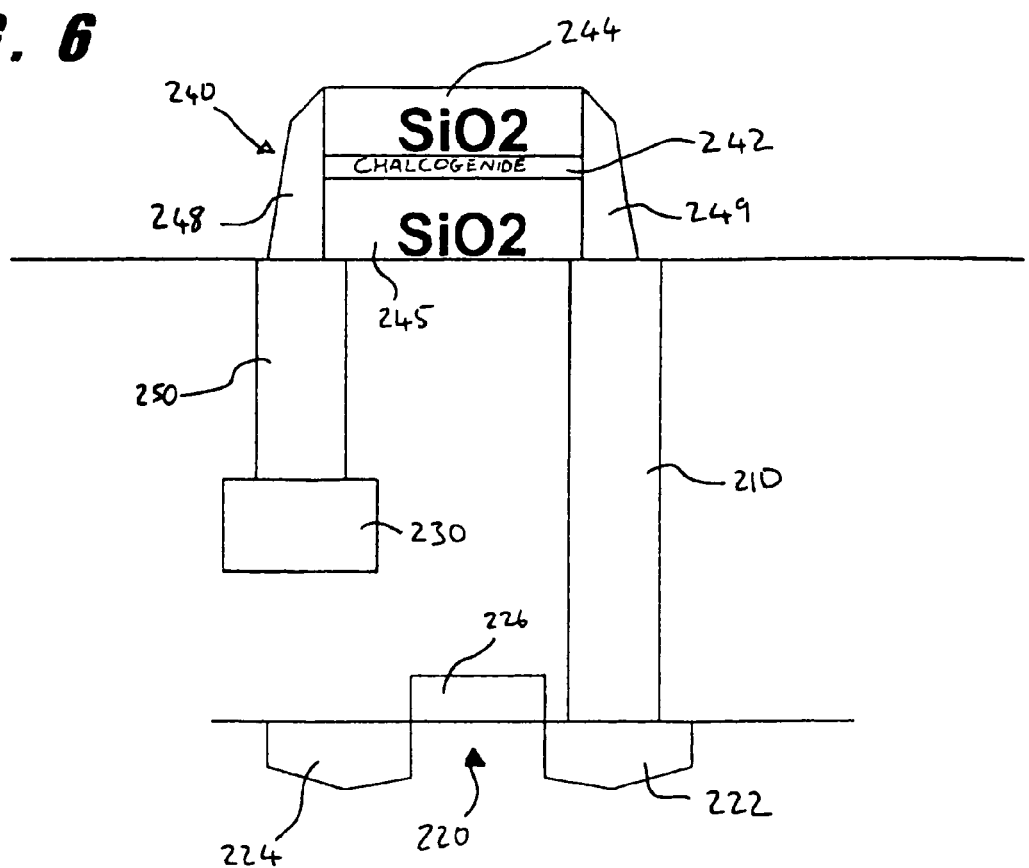
FIG. 6 is a cross-sectional schematic representation of a chalcogenide memory cell, in accordance with a third embodiment of the present invention.

FIG. 5 is a schematic diagram depicting a top view of a memory array comprising four chalcogenide memory cells, in accordance with the memory array of FIG. 3. FIG. 6 is a schematic representation of a chalcogenide memory cell 240, in accordance with a third embodiment of the present invention. The third embodiment of the present invention can differ from the first embodiment of the present invention in that, for example, the diode 10 is replaced with a second tungsten plug 210 and a selecting transistor 220 (for example, a MOS transistor having a gate terminal, a source terminal, and a drain terminal), in series with the chalcogenide memory cell 240.

As in the first embodiment, the chalcogenide memory cell 240 comprises a chalcogenide structure 242, a lower silicon-dioxide layer 245, an upper silicon dioxide layer 244, a pair of titanium nitride spacer structures 248, 249, and a chalcogenide layer 242; and the chalcogenide memory cell 240 is connected via a tungsten plug 250 to an aluminum line 230.

However, in the embodiment of FIG. 6, the chalcogenide memory cell 240 is coupled via a second tungsten plug 210 to the drain terminal 222 of the selecting transistor 220, and via the selecting transistor 220 to any further conductors that may be coupled to the source terminal 224 of the selecting transistor 220.

In other words, the chalcogenide memory cell comprises a CRAM cell 240 and a CMOS circuit that is operative to access the CRAM cell 240, similarly to the embodiments depicted in FIGS. 1-5. The CRAM cell 240 has a cross-sectional area determined by a thin film process and by an iso-etching process, and specifically, by a chalcogenide deposition thin film process and by an iso-etching process. The chalcogenide structure 242 is in series with a semiconductor device, which in the embodiment illustrated in FIG. 6 is a selecting transistor 220 that is operative to drive a current through the chalcogenide structure 242 when enabled by a voltage at a gate terminal 226 of the selecting transistor 220. The gate terminal 226 of the selecting transistor 220 is operatively coupled to a word line of a memory array. The source terminal 224 of the selecting transistor 220 is operatively coupled to a drive line of the memory array, and the drain terminal 222 of the selecting transistor 220 is operatively coupled to a bit line of the memory array.

Figure 7:
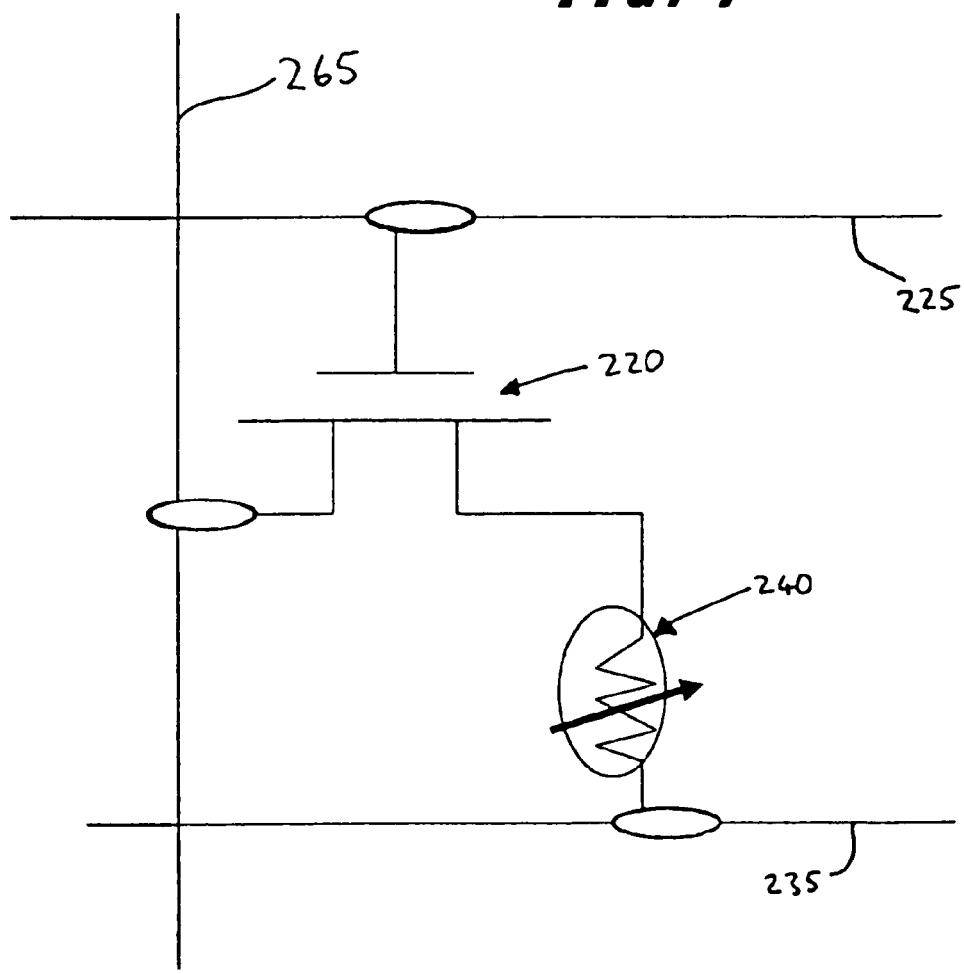
FIG. 7 is a schematic diagram depicting a chalcogenide memory cell, in accordance with the third embodiment of the present invention as depicted in FIG. 6.

FIG. 7 is a schematic diagram depicting a chalcogenide memory cell 240, in accordance with the third embodiment of the present invention as depicted in FIG. 6. The selecting transistor 220 is used to select the current through the chalcogenide memory cell 240. The word line 225, controlled by a CMOS circuit (not shown), does not have to carry currents large enough to write to a chalcogenide memory cell 240. The word line 225 need only carry the negligible current necessary to switch the selecting transistor 220 on.

As shown in FIG. 7, the current that is used to write to the chalcogenide memory cell 240 is obtained from a drive line 265, not from the word line as in the previous embodiments of the present invention. The drive line 265 is, for example, obtained from a current buffer (not shown) that is capable of generating relatively large currents. The drive line 265 provides a current that passes through the selecting transistor 220 to the chalcogenide memory cell 240 when the word line 225 has a voltage that is appropriate to turning on the selecting transistor 220. When writing to the CRAM cell 240, therefore, the selecting transistor 220 is useful since it can pass a current to the CRAM cell 240 that might be far greater than any current the word line itself may be capable of generating.

The selecting transistor 220 can therefore be useful when writing to the chalcogenide memory cell 240. However, the selecting transistor 220 can also be useful when reading from the chalcogenide memory cell 240. Since the voltage drop across the CRAM cell 240 depends on the current through the CRAM cell 240, allowing the drive line 265 to provide a relatively large current can ensure that the bit lines 235 are capable of resolving any data that might be implemented as a change in resistance at the CRAM cell 240.

Alternatively, with respect to reading, a current source/drain that draws a predetermined current may be used to read the chalcogenide memory cell 240. Since the embodiment of FIG. 6 allows the current through the CRAM cell 240 to pass harmlessly through the selecting transistor 220 and the drive line 265 rather than through the CMOS circuits of the word line 225, much greater currents may be used without endangering the CMOS circuits of the word line 225. The much greater currents generate a larger voltage drop across the CRAM cell 240 for the same data-dependent changes in resistance, ensuring that the data-dependent changes in resistance are resolvable.

Figure 8:
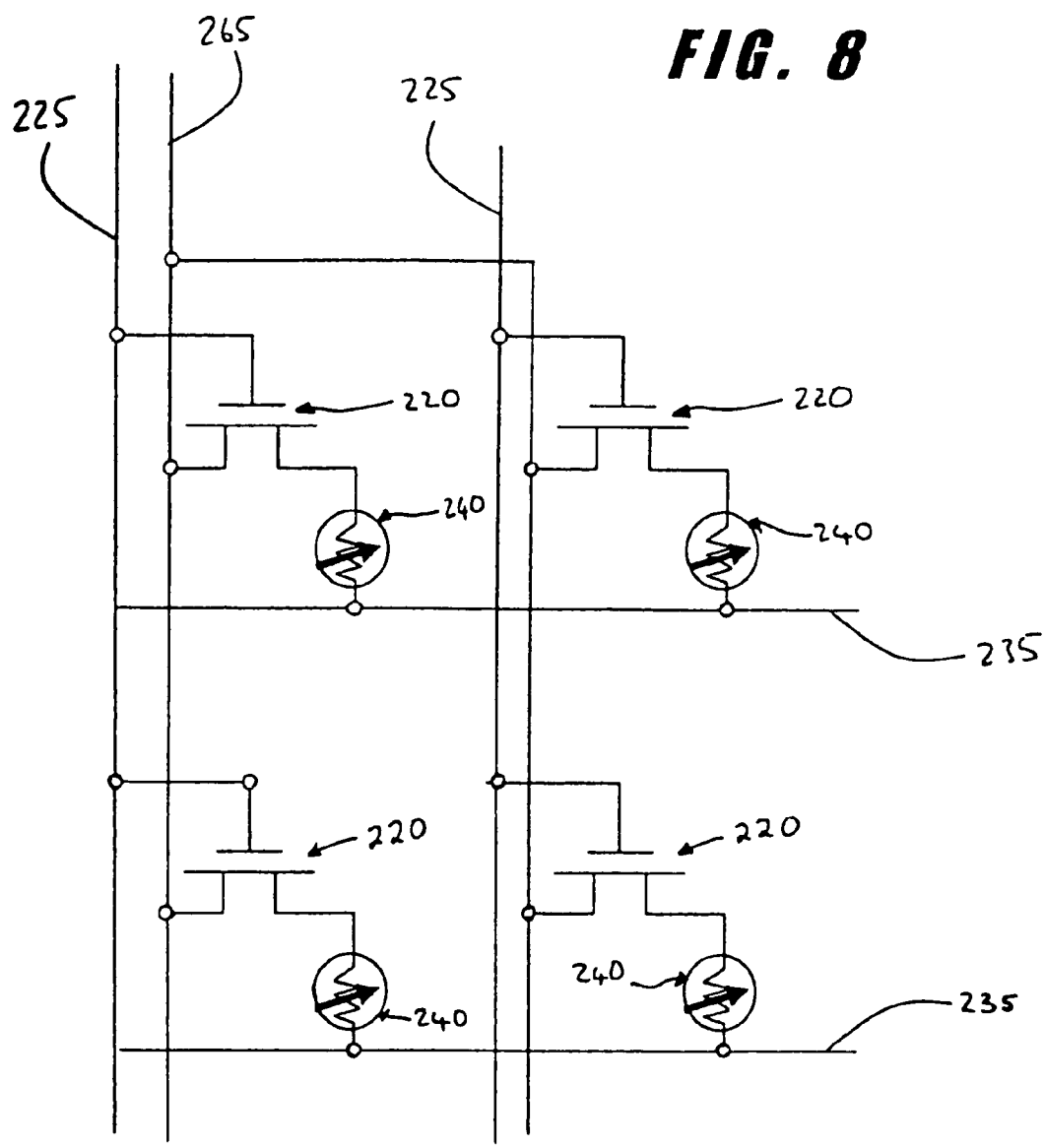
FIG. 8 is a schematic diagram depicting a memory array comprising four chalcogenide memory cells, each of which is in accordance with the chalcogenide memory cell of FIG. 7.
Figure 9:
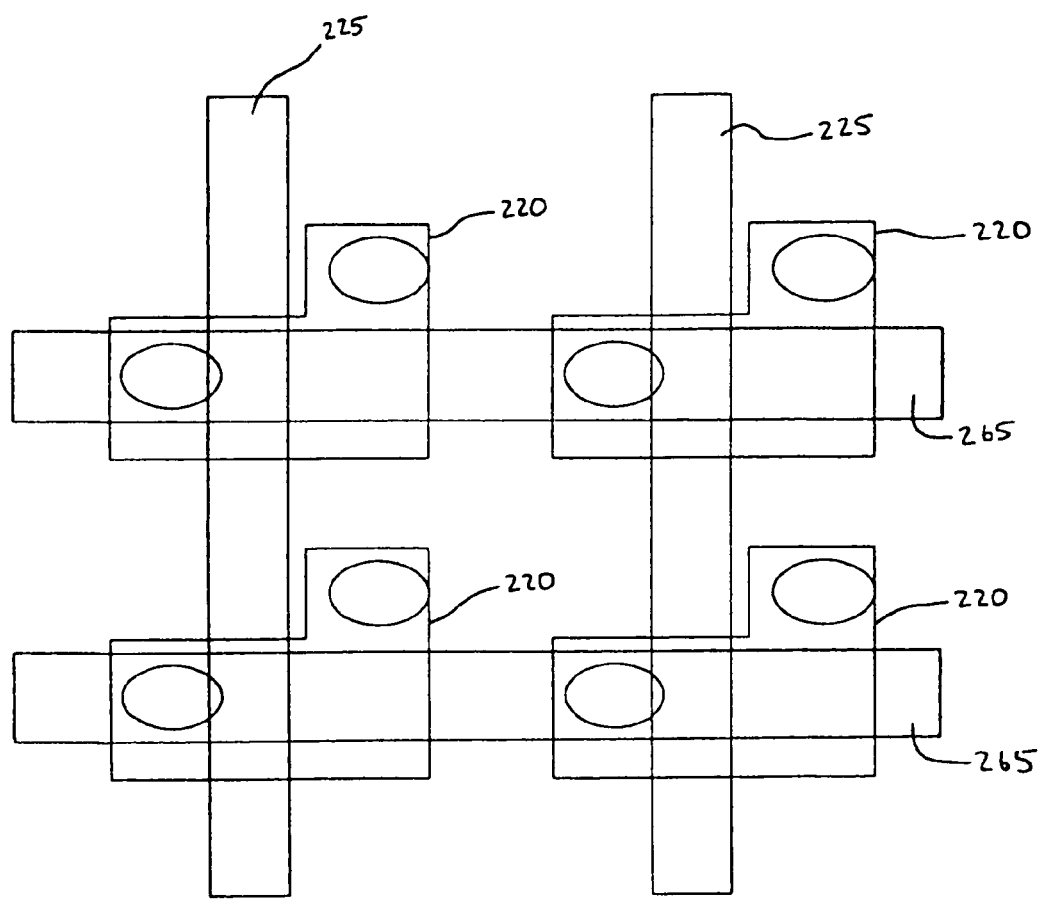
FIG. 9 is a schematic representation of a layout top view of a memory array, at a first metalization step, in accordance with the third embodiment of the present invention.
Figure 10:
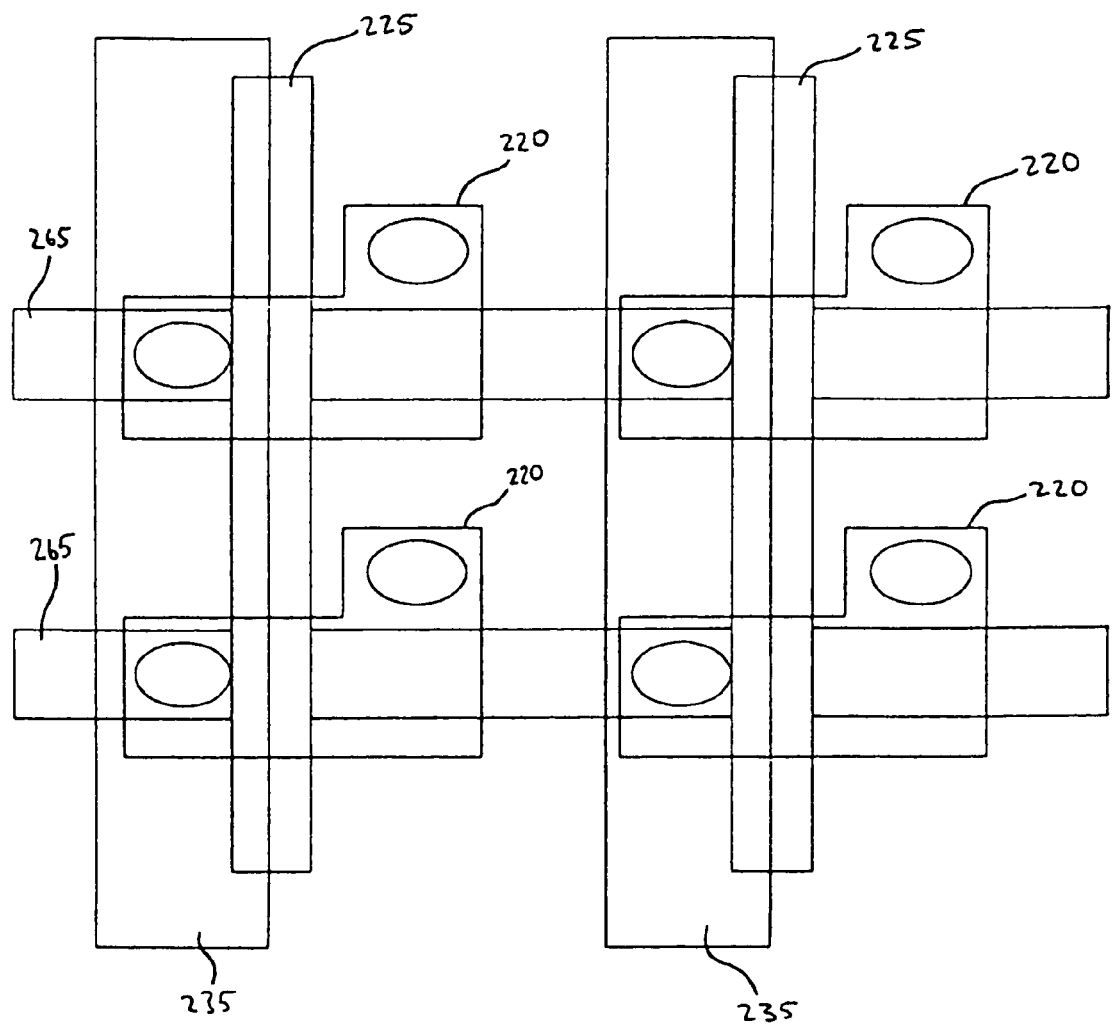
FIG. 10 is a schematic representation of a layout top view of the memory array, at a second metalization step, in accordance with the third embodiment of the present invention.
Figure 11:
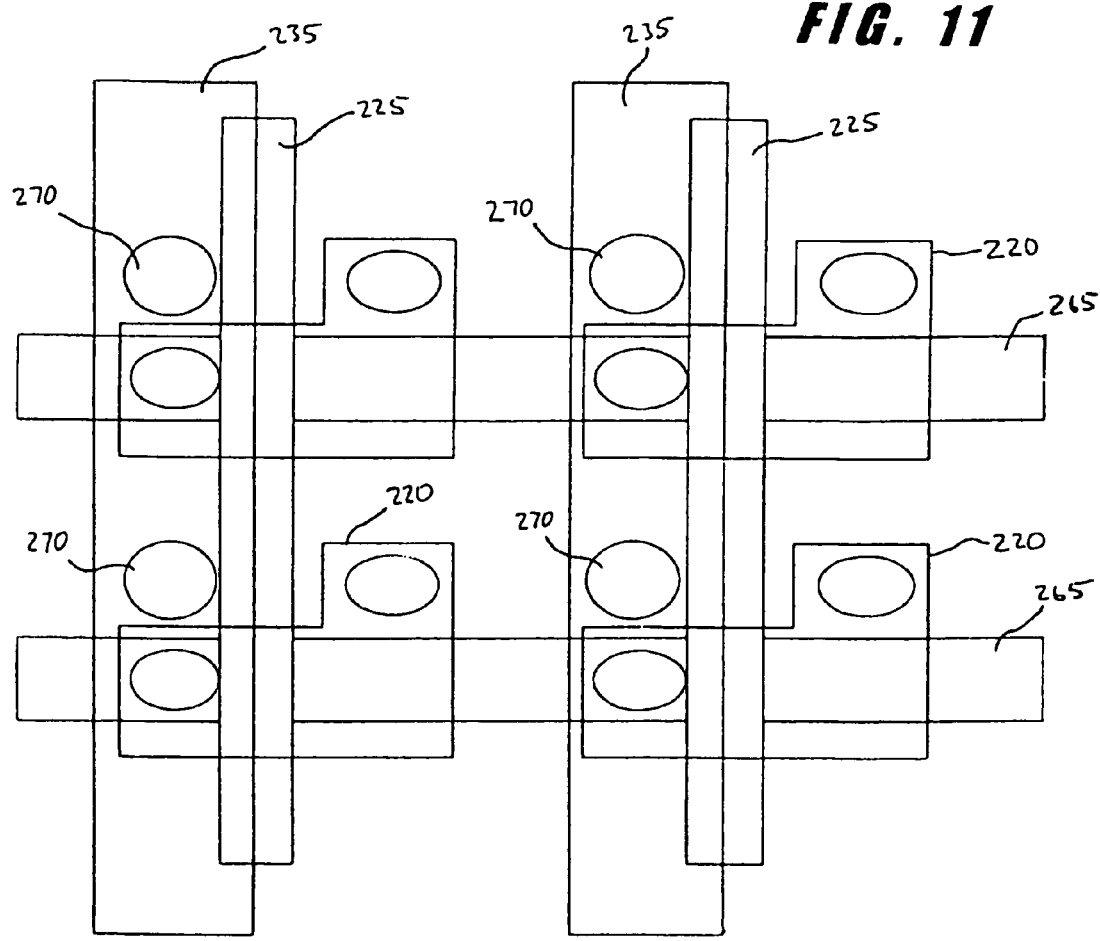
FIG. 11 is a schematic representation of a layout top view of the memory array, at a via etch step, in accordance with the third embodiment of the present invention.
Figure 12:
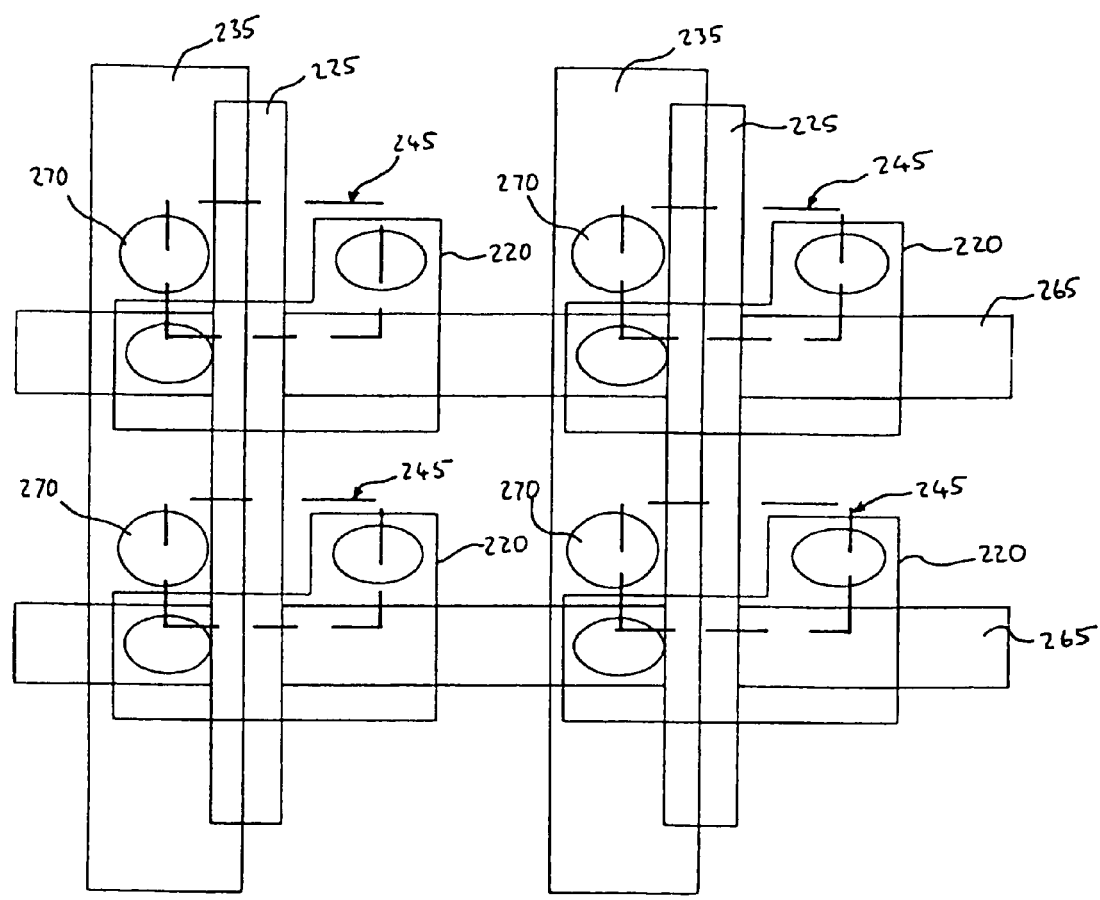
FIG. 12 is a schematic representation of a layout top view of the memory array, after implementation of the vias, showing a location of each chalcogenide memory cell.

FIG. 8 is a schematic diagram depicting a memory array comprising four chalcogenide memory cells, each of which is in accordance with the chalcogenide memory cell 240 of FIG. 7. FIG. 9 is a schematic representation of a layout top view of a memory array, at a first metalization step, in accordance with the third embodiment of the present invention. FIG. 10 is a schematic representation of a layout top view of the memory array, at a second metalization step, in accordance with the third embodiment of the present invention. FIG. 11 is a schematic representation of a layout top view of the memory array, at a via etch step, in accordance with the third embodiment of the present invention. The vias 270 allow external access to the bit lines 235. FIG. 12 is a schematic representation of a layout top view of the memory array, after implementation of the vias 270. This figure shows the location of each chalcogenide memory cell 245.

Figure 13A:
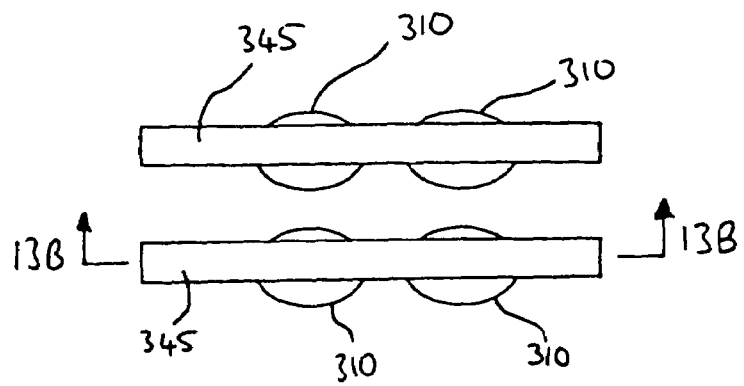
FIGS. 13A and 13B are a schematic representations of a cell formation flow process, in accordance with a fourth embodiment of the present invention.
Figure 13B:
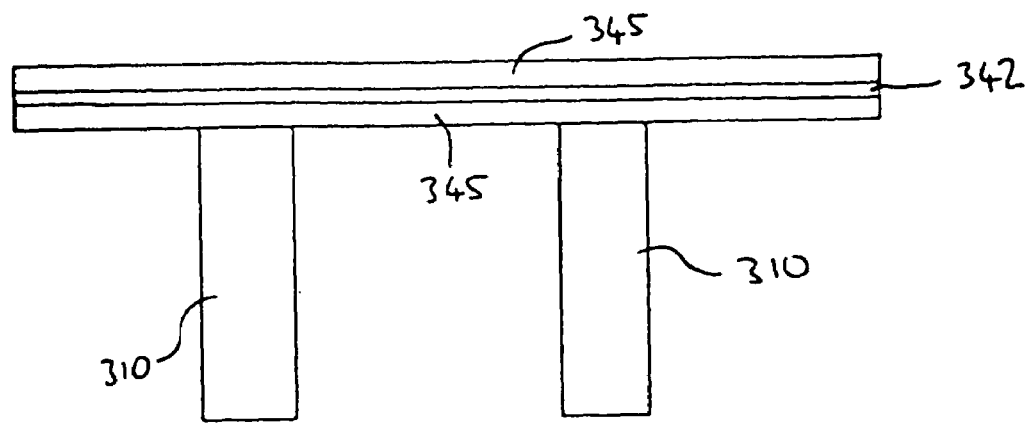

FIG. 13A is a top plan schematic representation of a cell formation flow process, and FIG. 13B is a cross-sectional view of FIG. 13A, in accordance with a fourth embodiment of the present invention. In a first step, a tungsten plug structure 310 is implemented on a silicon dioxide substrate. The tungsten structure may be another structure, such as a p-poly structure or a diode. In a second step, an oxide layer/chalcogenide/oxide sandwich structure is implemented onto the result of the first step. The oxide layer may be deposited using CVD methods and the chalcogenide is deposited using sputtering methods. In a third step, the sandwich structure is patterned in accordance with photolithography (i.e., lithography) techniques. A pattern is etched in the oxide layer. The pattern need not be deep, since only shallow trenches are desired in a preferred embodiment. In a fourth step, the chalcogenide layer is iso-etched, removing substantially all of the chalcogenide except where the chalcogenide is placed at the center of the memory unit cell. FIG. 13A thus shows a top plan view of a memory array, with FIG. 13B showing a cross section view of a single chalcogenide memory cell within the memory array.

Figure 14A:
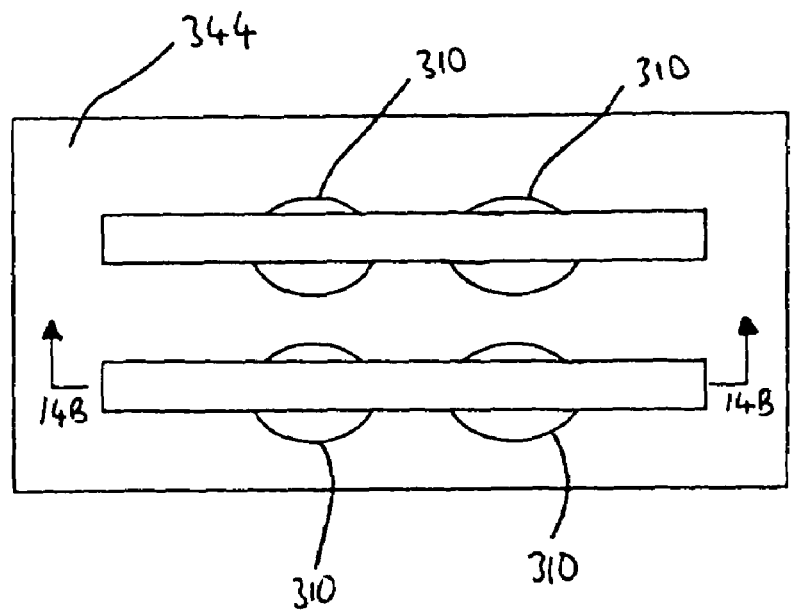
FIGS. 14A and 14B are a schematic diagrams of a fifth step, in accordance with the process presented in FIG. 13.
Figure 14B:
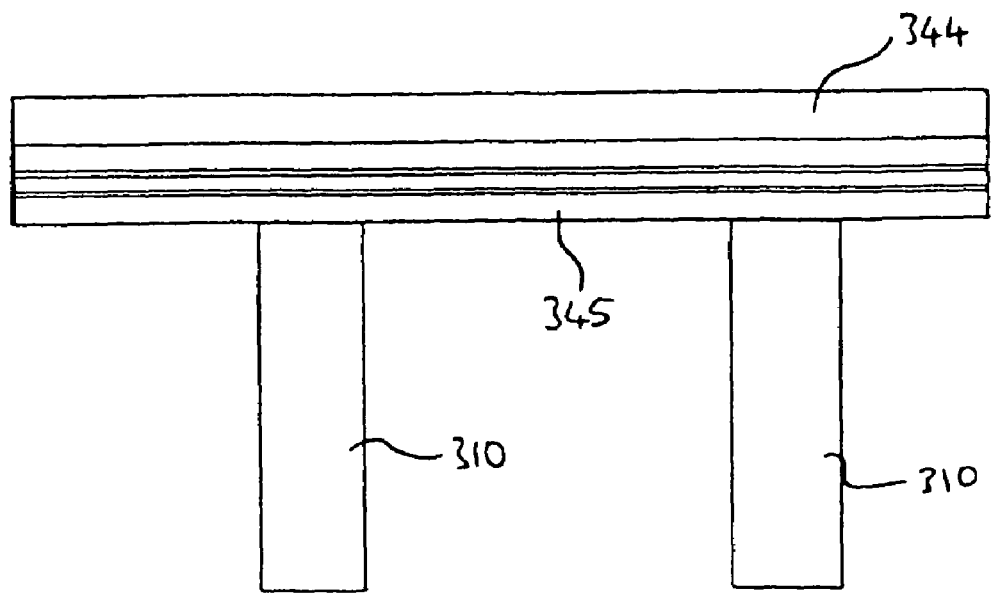
Figure 15A:
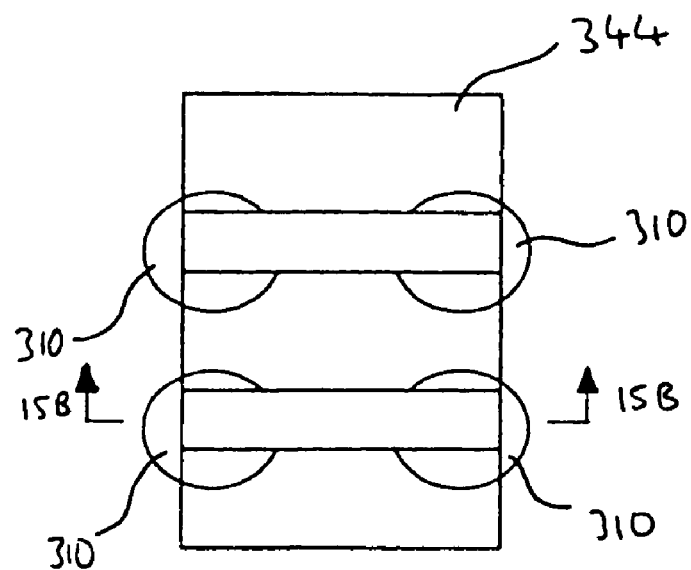
FIGS. 15A and 15B are a schematic diagrams of a sixth step, in accordance with the process presented in FIG. 13 and FIG. 14.
Figure 15B:
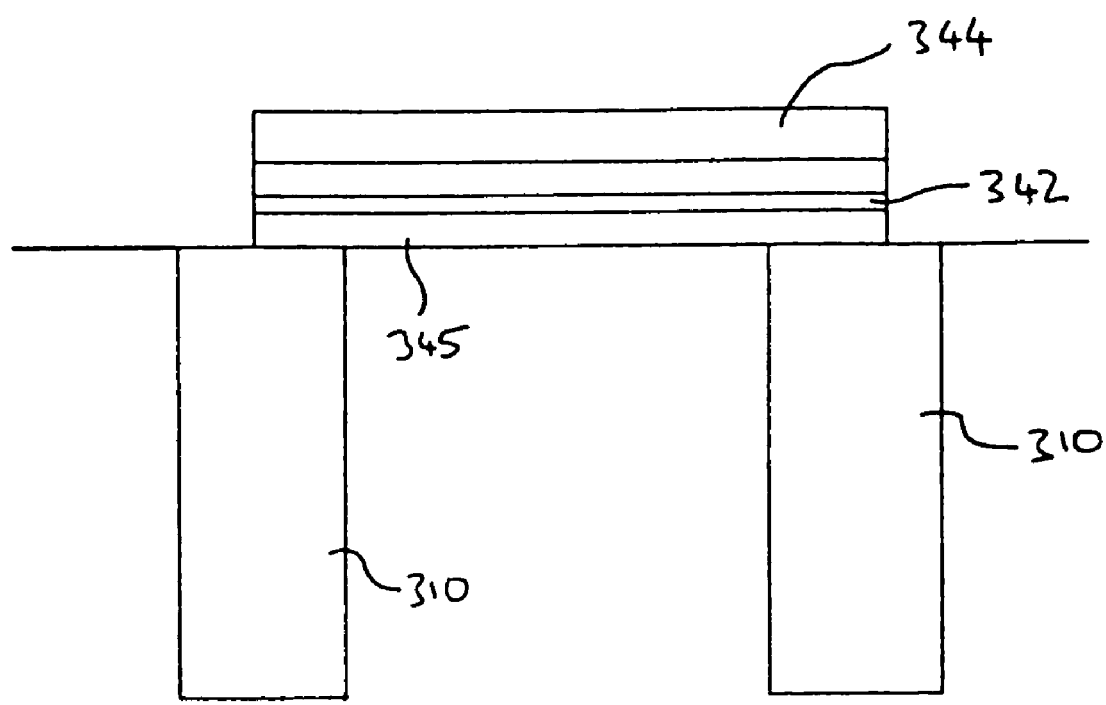

FIGS. 14A and 14B are a top plan and cross-sectional schematic diagrams of a fifth step, in accordance with the process presented in FIGS. 13A and 13B. As shown in FIGS. 14A and 14B, the entire memory array is covered with an additional oxide layer. FIGS. 15A and 15B are top plan and cross-sectional schematic diagrams of a sixth step, in accordance with the process presented in FIGS. 13A, 13B, 14A, and FIG. 14B, wherein FIGS. 15A and 15B continue the process initially described in FIGS. 13A, 13B, 14A and 14B. As shown in FIGS. 15A and 15B, each of the chalcogenide memory cells within the entire memory array is patterned. Patterning may be accomplished, for example, by photolithographic etching using, for example, any etch that is not selective to tungsten (or to any other material used in the first step, as presented with reference to FIGS. 13A and 13B).

Figure 16A:
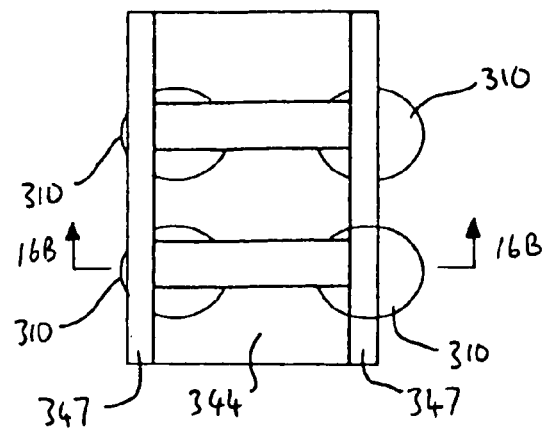
FIGS. 16A and 16B are a schematic diagrams of a seventh step, in accordance with the process presented in FIGS. 13-15.
Figure 16B:
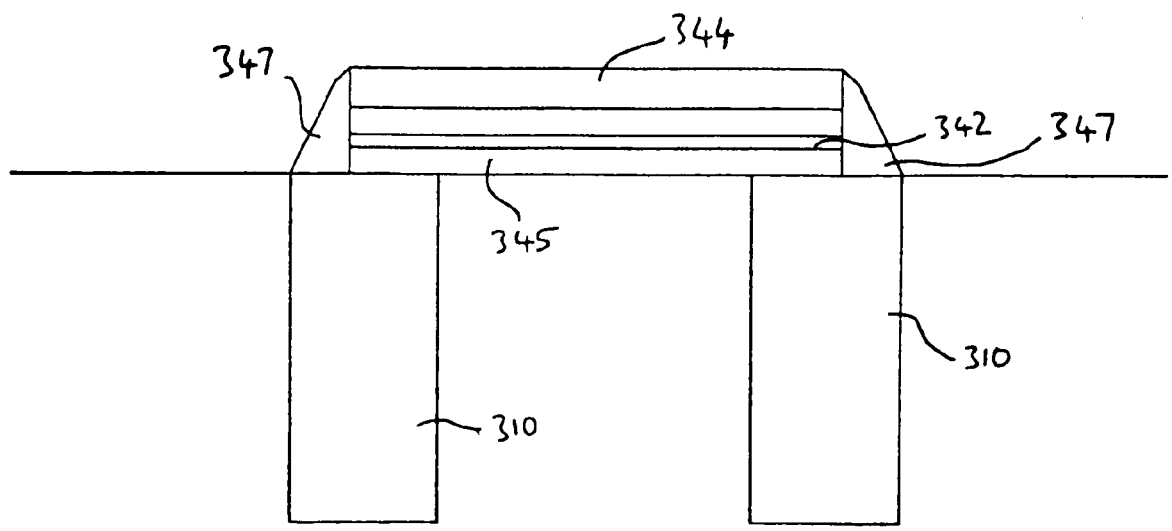
Figure 17A:
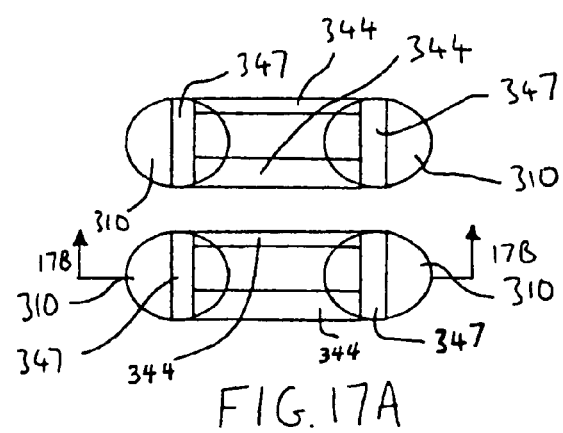
FIGS. 17A and 17B are a schematic diagrams of an eighth step, in accordance with the process presented in FIGS. 13-16.
Figure 17B:
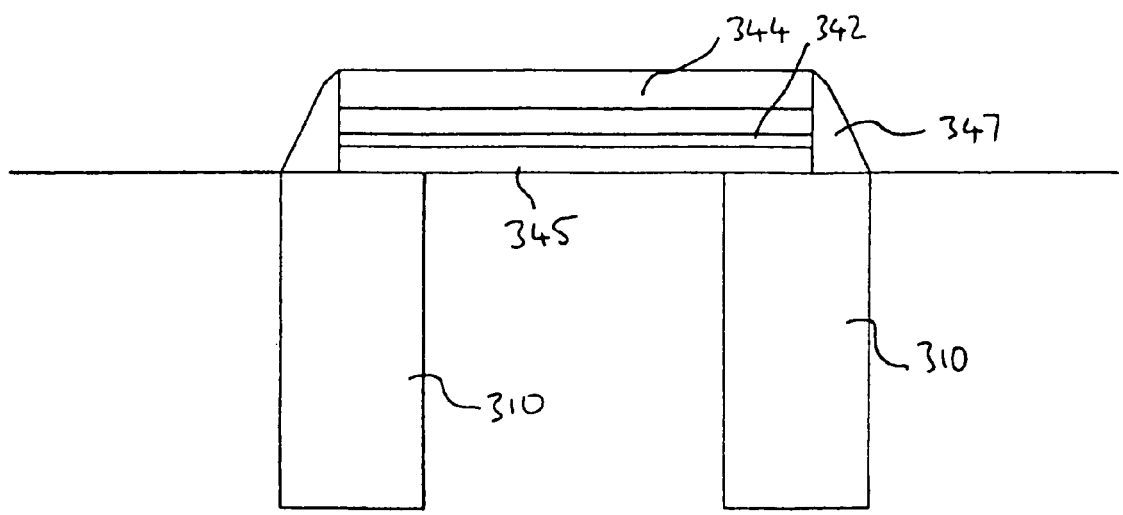

FIGS. 16A and 16B are top plan and cross-sectional schematic diagrams of a seventh step, in accordance with the process presented in FIGS. 13A-15B, wherein FIGS. 16A and 16B continue the process initially described in FIGS. 13A-15B. As shown in FIGS. 16A and 16B, a titanium nitride layer is deposited onto the memory array, and etched to form a contact between the tungsten (and any other material used in the first step, as presented with reference to FIGS. 13A and 13B) and the chalcogenide. FIGS. 17A and 17B are top plan and cross-sectional schematic diagrams of yet an eighth step, in accordance with the process presented in FIGS. 13A-16B, wherein FIGS. 17A and 17B continue the process initially described in FIGS. 13A-16B. As shown in FIGS. 17A and 17B, the titanium nitride layer and thick oxide layer are further etched to isolate each CRAM cell of the memory array. Accordingly, FIGS. 13A-17B present a method of fabricating a chalcogenide memory array that can achieve various advantages of the present invention.

In view of the foregoing, it will be understood by those skilled in the art that the methods of the present invention can facilitate formation of read only memory devices, and in particular read only memory devices exhibiting dual bit cell structures, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A memory cell comprising:
   a phase change structure having a pair of spacers;
   a first signal line electrically coupled to a first conductor;
   a second signal line electrically coupled to a second conductor comprising a steering device, wherein said first and second conductors are respectively connected to said phase change structure through the pair of spacers that comprises a first conducting element and a second conducting element, said first conducting element and said second conducting element being arranged at the left sidewall and right sidewall of said phase change structure respectively, and wherein said first and second conducting elements are different from said first and second conductors.

2. The memory cell of claim 1, wherein a CMOS circuit is operative to access the memory cell.

3. The memory cell of claim 1, wherein the material of the conducting elements is TiN.

4. The memory cell of claim 1, wherein the steering device is a diode.

5. The memory cell of claim 1, wherein the steering device is a transistor.

6. The memory cell of claim 5, wherein the transistor comprises a gate terminal coupled to said second line, a source terminal coupled to a drive line, and a drain terminal coupled to said first line.

7. The memory cell of claim 5, wherein a via is formed and allows external access to the first signal line.

8. The memory cell of claim 1, wherein the phase change structure is made of chalcogenide based material.

9. The memory cell of claim 1, wherein the phase change structure has a longitudinal dimension, a lateral dimension, and an altitudinal dimension, wherein the longitudinal, lateral, and altitudinal dimensions of the phase change structure are determined by a thin film process and by an iso-etching process.

10. The memory cell of claim 1, the steering device allows a current through the phase change structure.

11. A memory cell comprising:
    a phase change structure having a pair of spacers;
    a first signal line electrically coupled to a first conductor;
    a second signal line electrically coupled to a second conductor comprising a steering device, wherein said first and second conductors are respectively connected to said phase change structure through the pair of spacers that comprises a first conducting element and a second conducting element, said first conducting element and said second conducting element being arranged at the left sidewall and right sidewall of said phase change structure respectively, and wherein the electric current is directed from said first conductor to said second conductor 12. The memory cell of claim 11, wherein a CMOS circuit is operative to access the memory cell.

13. The memory cell of claim 11, wherein the material of the conducting elements is TiN.

14. The memory cell of claim 11, wherein the steering device is a diode.

15. The memory cell of claim 11, wherein the steering device is a transistor

16. The memory cell of claim 15, wherein the transistor comprises a gate terminal coupled to said second line, a source terminal coupled to a drive line, and a drain terminal coupled to said first line.

17. The memory cell of claim 15, wherein a via is formed and allows external access to the first signal line.

18. The memory cell of claim 11, wherein the phase change structure is made of chalcogenide based material.

19. The memory cell of claim 11, wherein the phase change structure has a longitudinal dimension, a lateral dimension, and an altitudinal dimension, wherein the longitudinal, lateral, and altitudinal dimensions of the phase change structure are determined by a thin film process and by an iso-etching process.

20. The memory cell of claim 11, wherein said first and second conducting elements are different from said first and second conductors.

* * * * *